United States Patent
Franz et al.

(10) Patent No.: US 10,765,040 B2
(45) Date of Patent: Sep. 1, 2020

(54) CHASSIS COOLING RESOURCE

(71) Applicant: Hewlett Packard Enterprise Development LP, Houston, TX (US)

(72) Inventors: John P. Franz, Houston, TX (US); Tahir Cader, Liberty Lake, TX (US); Matthew Richard Slaby, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 42 days.

(21) Appl. No.: 15/665,334

(22) Filed: Jul. 31, 2017

(65) Prior Publication Data

US 2019/0037734 A1     Jan. 31, 2019

(51) Int. Cl.
G05B 15/02 (2006.01)
H05K 7/20 (2006.01)
G01L 13/00 (2006.01)

(52) U.S. Cl.
CPC ......... *H05K 7/20836* (2013.01); *G05B 15/02* (2013.01); *H05K 7/20772* (2013.01); *H05K 7/20781* (2013.01); *G01L 13/00* (2013.01)

(58) Field of Classification Search
CPC ........... H05K 7/20836; H05K 7/20772; H05K 7/20781; G05B 15/02; G01L 13/00
See application file for complete search history.

(56) References Cited

U.S. PATENT DOCUMENTS

| | | | |
|---|---|---|---|
| 5,389,125 A * | 2/1995 | Thayer | B01D 53/0454 95/11 |
| 6,845,184 B1 | 1/2005 | Yoshimura et al. | |
| 7,551,971 B2 * | 6/2009 | Hillis | H05K 7/1497 267/140.11 |
| 7,660,121 B2 | 2/2010 | Campbell et al. | |
| 8,583,290 B2 | 11/2013 | Campbell et al. | |
| 9,101,078 B2 | 8/2015 | Campbell et al. | |
| 9,606,588 B2 | 3/2017 | Dean et al. | |
| 2007/0227710 A1 | 10/2007 | Belady et al. | |
| 2008/0212265 A1 * | 9/2008 | Mazura | H05K 7/20754 361/678 |
| 2008/0266726 A1 | 10/2008 | Murakami et al. | |
| 2011/0063701 A1 | 3/2011 | Yankov | |
| 2013/0279648 A1 * | 10/2013 | Joshi | G05D 23/1931 378/19 |
| 2013/0308267 A1 | 11/2013 | Wu et al. | |
| 2013/0345893 A1 * | 12/2013 | David | G05D 23/00 700/300 |

(Continued)

OTHER PUBLICATIONS

Lin, P., et al, "Data Center Temperature Rise During a Cooling System Outage", Schneider Electric, White Paper 179 Revision 1, Jun. 26, 2017, 13 pages.

*Primary Examiner* — Rocio Del Mar Perez-Velez
*Assistant Examiner* — Brian T McMenemy
(74) *Attorney, Agent, or Firm* — Brooks, Cameron & Huebsch, PLLC

(57) ABSTRACT

Example implementations relate to a chassis cooling resource. In some examples, a chassis cooling resource includes a controller, comprising instructions to detect a failure corresponding to a first cooling system of a first chassis coupled to a server rack, and alter settings of a second cooling system of a second chassis coupled the server rack to provide additional cooling resources to the first cooling system in response to the detected failure.

4 Claims, 5 Drawing Sheets

(56) References Cited

U.S. PATENT DOCUMENTS

| | | | |
|---|---|---|---|
| 2014/0060799 A1 | 3/2014 | Eckberg et al. | |
| 2014/0244002 A1* | 8/2014 | Decker | G05B 19/056 |
| | | | 700/51 |
| 2016/0120064 A1* | 4/2016 | Shedd | F28F 13/02 |
| | | | 165/104.27 |
| 2016/0242326 A1* | 8/2016 | Edwards | H05K 7/20272 |
| 2017/0218833 A1* | 8/2017 | Mitteer | B60K 1/00 |
| 2017/0257275 A1* | 9/2017 | Atyam | H04L 41/0893 |
| 2018/0192538 A1* | 7/2018 | Sakalkar | H05K 7/1492 |
| 2018/0341298 A1* | 11/2018 | Cheng | H05K 7/20818 |

\* cited by examiner

CHASSIS COOLING RESOURCE

BACKGROUND

A coolant distribution unit (CDU) can deliver conditioned liquid (e.g., water) to a number of racks in a datacenter. The CDUs within a datacenter can operate with redundancy to ensure that if one or more CDUs malfunction that additional CDUs can maintain cooling of the racks. A number of CDUs can each include an individual reservoir to contain excess liquid for utilizing with a cooling system coupled to the number of CDUs. The conditioned liquid can be received at a number of server racks that include a plurality of server chassis.

DETAILED DESCRIPTION

Figure 1:
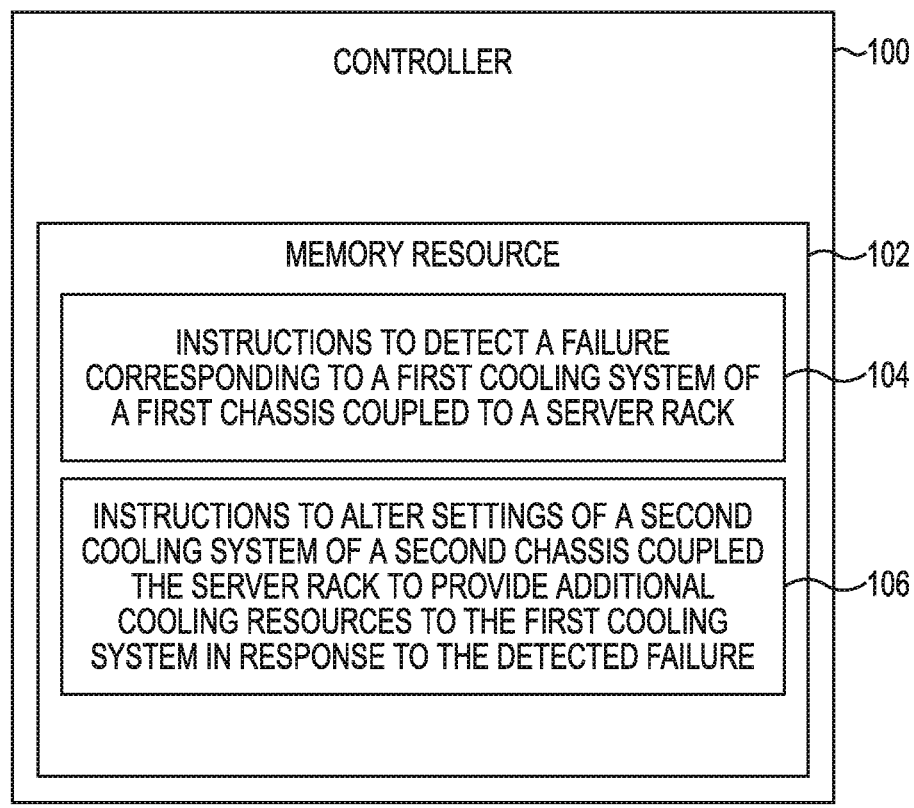
FIG. 1 illustrates an example controller for a chassis cooling resource consistent with the present disclosure.

Coolant distribution units (CDUs) can utilize an enclosed loop to deliver conditioned liquid (e.g., water, coolant, etc.) to computing devices within a server chassis and/or a server rack. In some examples, the CDU can deliver the conditioned liquid to cooling racks or liquid to liquid heat exchangers (e.g., rear door heat exchangers, etc.) that can be coupled to a chassis of a server rack. In previous systems, the liquid to liquid heat exchanger in combination with a plurality of pumps can deliver the liquid to a plurality of server chassis coupled to a server rack.

In some examples, each of the server chassis can include a plurality of server blades that are independent from each of the other server chassis. For example, a first server chassis can include a plurality of server blades that are monitored and controlled separately from a second server chassis. In some examples, the plurality of server chassis can be powered independently. For example, a first server chassis can receive electrical power at a first connection of a power distribution unit (PDU) and a second server chassis can receive electrical power at a second connection of the PDU. In some examples, a power failure of one server chassis may not affect other server chassis within the same server rack. In addition, other types of failures (e.g., controller failure, pump failure etc.) for one chassis may not affect a different chassis coupled to the same server rack.

Systems described herein can be utilized to detect a failure of a cooling system, a failure of a controller, a power failure, and/or a failure of a device that may affect the cooling system of a particular chassis coupled to a server rack. The systems described herein can be utilized to alter settings of a different chassis to provide additional cooling resources to the particular chassis. Thus, the systems described herein can be utilized as a failover system for cooling systems of a plurality of server chassis coupled to a server rack. For example, when a failure occurs at a first cooling system, a second cooling system can provide cooling resources to the first cooling system. In other examples, the systems described herein can be utilized to determine a usage level (e.g., power usage level, usage state, etc.) of a first server chassis coupled to the server rack and alter settings of a second server chassis based on the determined usage level of the first server chassis. In these examples, the second server chassis can provide cooling resources to the first server chassis based on the determined usage level.

The systems described herein can increase a pumping capacity and redundancy for each of the plurality of server chassis coupled to a server rack. In addition, the systems described herein can provide an increase in pumping and powering flexibility, which can be utilized to allocate cooling resources based on a usage of particular server chassis coupled to the server rack. Furthermore, the systems described herein can be utilized to support additional functionality (e.g., turbo mode, overclocking, etc.) of computing devices coupled to each of the plurality of server chassis by utilizing the increased pumping capacity of the system.

FIG. 1 illustrates an example controller 100 for a chassis cooling resource consistent with the present disclosure. The controller 100 may perform a function related to chassis cooling resource. As illustrated in FIG. 1, the controller 100 may comprise a processing resource and a memory resource 102 storing machine-readable instructions to cause the processing resource to perform an operation relating to chassis cooling resource. In some examples, the controller 100 can be a chassis controller that is coupled to a particular server chassis and control functions of the particular server chassis. For example, the controller 100 can be utilized to monitor a functionality of a server chassis and/or perform functions relating to the cooling system of the server chassis. In some examples, each server chassis coupled to a server rack can include a corresponding chassis controller. In other examples, the controller 100 can be a controller for a plurality of server chassis coupled to the server rack.

The controller 100 may include instructions 104 stored in the memory resource 104 and executable by a processing resource to detect a failure corresponding to a first cooling system of a first chassis coupled to a server rack. In some examples, the controller 100 can determine that one or more features of the first cooling system are non-functional or non-responsive. For example, the detected failure can be a failure of a pump coupled to the first chassis and/or the first cooling system. In this example, the pump failure can occur when a pump that is coupled to the first chassis is non-functional, is performing below a threshold level, and/or is not performing to manufacturer specifications. In some examples, a pump failure can include an inability of the pump to keep up with a particular demand. For example, the controller 100 can determine that a power level of a first chassis is above a threshold for a pump coupled to the first chassis. In this example, it can be determined that the pump of the first chassis has failed or is not performing to a manufacturer specification.

In some examples, the detected failure can be a power failure of the first chassis that can affect the first cooling system. For example, the controller 100 can detect that a power failure has occurred with the first server chassis. In this example, the controller 100 can detect the power failure based on a non-responsive heartbeat message from a controller corresponding to the first server chassis. For example, the controller corresponding to the first chassis can send heartbeat messages to the controller 100 during normal operation. In this example, the controller 100 may not receive a heartbeat message from the controller corresponding to the first chassis when there is a power failure. In another example, the controller 100 may not receive a signal from the controller corresponding to the first server chassis and determine that the controller corresponding to the first server chassis has failed or is not functioning to a manufacturer specification. In this example, the controller 100 can alter settings to provide resources to the first chassis and/or first cooling system of the first chassis based on the detected failure.

The controller 100 may include instructions 106 stored in the memory resource 104 and executable by a processing resource to alter settings of a second cooling system of a second chassis coupled to the server rack to provide additional cooling resources to the first cooling system in response to the detected failure. In some examples, the controller 100 can be communicatively coupled to the second chassis to alter settings of the second chassis and/or the second cooling system of the second chassis. For example, the controller 100 can be a chassis controller for the second chassis. In another example, the controller 100 can be a controller for the server rack that includes the first chassis and the second chassis.

In some examples, the instructions 106 can include instructions to alter settings of a pump coupled to the second chassis to provide additional cooling resources to the first cooling system coupled to the first chassis. For example, the first cooling system and the second cooling system can be coupled together by an auxiliary input manifold. In this example, the controller 100 can utilize the auxiliary input manifold and increase a pump speed of a pump coupled to the second chassis to provide additional cooling resources to the first cooling system via the auxiliary input manifold.

In some examples, the altered setting can include an increase in pump speed for a pump coupled to the second chassis to provide cooling resources to the first cooling system when a pump coupled to the first chassis is inactivated due to a power failure of the first chassis. For example, the controller 100 can detect that a power failure has occurred at the first chassis. In this example, the controller 100 can activate an auxiliary power connection between the first chassis and the second chassis to provide power to the first chassis. In this example, the controller 100 can also utilize an auxiliary input manifold to provide cooling resources from the second cooling system to the first cooling system of the first chassis. In some examples, the controller 100 can provide power to the pump coupled to the first chassis via the auxiliary power connection when the first chassis loses power.

In some examples, the controller 100 can deactivate a controller of the first chassis and perform the functions of the controller of the first chassis. For example, the controller 100 can be positioned within the second chassis and deactivate the controller within the first chassis and perform the functions of the controller positioned within the first chassis as well as perform the functions corresponding to the second chassis. In this way, the controller 100 can act as a back-up controller for the first chassis and add additional controller redundancy. In another example, the detected failure can include a chassis controller of the first chassis losing controller signal. As used herein, a controller signal can, for example, be a heartbeat message or other type of signal that is utilized to determine when the chassis controller is functioning properly. In some examples, the controller 100 can determine that the chassis controller of the first chassis is non-functional or has failed and deactivate the chassis controller of the first chassis as described herein.

The controller 100 can be utilized as a chassis controller for a specific chassis (e.g., second chassis) or a central controller for a plurality of chassis coupled to the server rack. The controller 100 can be utilized as a failover controller when there is a failure of a chassis (e.g., chassis controller loses controller signal, chassis loses power, chassis cooling system fails, chassis pump fails, etc.). In some examples, the controller 100 can be utilized to redistribute cooling resources from an active chassis cooling system to a failed chassis cooling system to provide a more redundant server rack.

Figure 2:
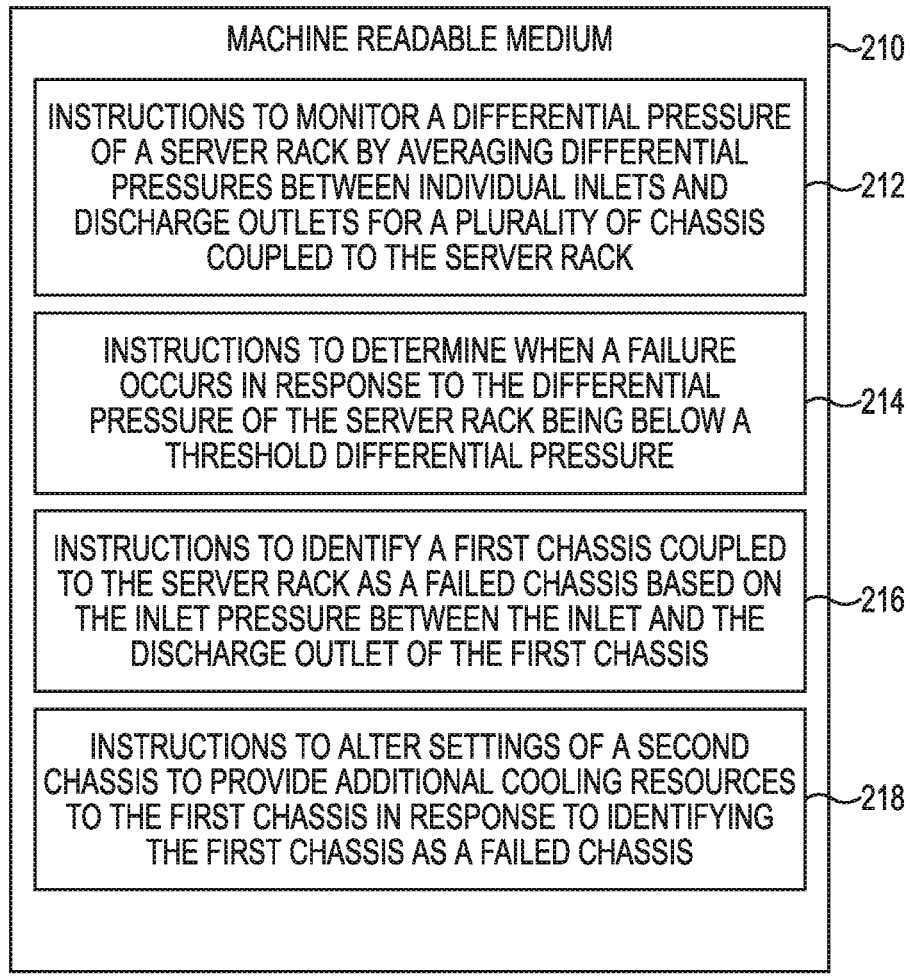
FIG. 2 illustrates an example memory resource for a chassis cooling resource consistent with the present disclosure.

FIG. 2 illustrates an example memory resource 210 for a chassis cooling resource consistent with the present disclosure. As used herein, a memory resource 210 can be a non-transitory machine-readable storage medium. Although the following descriptions refer to an individual memory resource 210, the descriptions may also apply to a system with multiple processing resources and multiple machine-readable storage mediums. In such examples, the instructions may be distributed across multiple machine-readable storage mediums and the instructions may be distributed across multiple processing resources. Put another way, the instructions may be stored across multiple machine-readable storage mediums and executed across multiple processing resources, such as in a distributed computing environment.

In some examples, the memory resource 210 can be coupled to a processing resource. A processing resource may be a central processing unit (CPU), microprocessor, and/or other hardware device suitable for retrieval and execution of instructions stored in the memory resource 210. In some examples, a processing resource may receive, determine, and send instructions 212, 214, 216, and 218. As an alternative or in addition to retrieving and executing instructions, a processing resource may include an electronic circuit comprising an electronic component for performing the operations of the instructions in the memory resource 210. With respect to the executable instruction representations or boxes described and shown herein, it should be understood that part or all of the executable instructions and/or electronic circuits included within one box may be included in a different box shown in the figures or in a different box not shown.

Memory resource 210 may be any electronic, magnetic, optical, or other physical storage device that stores executable instructions. Thus, memory resource 210 may be, for example, Random Access Memory (RAM), an Electrically-Erasable Programmable Read-Only Memory (EEPROM), a storage drive, an optical disc, and the like. The executable instructions may be "installed" on the memory resource 210. Memory resource 210 may be a portable, external or remote storage medium, for example, that allows a system that includes the memory resource 210 to download the instructions from the portable/external/remote storage medium. In this situation, the executable instructions may be part of an "installation package". As described herein, memory resource 210 may be encoded with executable instructions related to a locking mechanism of a module of a data center.

The memory resource 210 can include instructions 212 that can be executable by a processing resource to monitor a differential pressure of a server rack by averaging differential pressures between individual inlets and outlets (e.g., discharge outlets, etc.) for a plurality of chassis coupled to the server rack. As used herein, a differential pressure can, for example, include a pressure difference between an inlet or input pressure and an output or discharge pressure. For example, a liquid cooling system can include an inlet where liquid cooling resources (e.g., water, etc.) are received from a liquid to liquid heat exchanger or input manifold. In this example, the liquid cooling system can include an outlet where liquid cooling resources are removed from a chassis to an output manifold. The differential pressure can be the difference between an absolute value of the liquid pressure at the inlet and an absolute value of the liquid pressure at the outlet.

The memory resource 210 can include instructions 214 that can be executable by a processing resource to determine when a failure occurs in response to the differential pressure of the server rack being below a threshold differential pressure. In some examples, the differential pressure of a server rack can be utilized to determine when a failure of one or more chassis cooling systems has occurred. For example, a differential pressure of a server rack above a threshold differential pressure can indicate that the chassis cooling systems of the server rack are operating normally (e.g., operating within a manufacturer specification, etc.). In another example, a differential pressure of the server rack below a threshold differential pressure can indicate that one or more chassis cooling systems have failed or are non-functional (e.g., operating outside a manufacturer specification, etc.).

In some examples, each of a plurality of chassis coupled to the server rack can include a plurality of pressure sensors to determine the inlet pressure and the outlet pressure for each of a plurality of chassis. In some examples, the inlet pressure and outlet pressure for each of the plurality of chassis can be utilized to determine differential pressure of the server rack. For example, the differential pressure for each of the plurality of chassis coupled to the server rack can be averaged (e.g., mean, median, average, etc.) to determine an estimated differential pressure for the server rack. As used herein, an average can, for example, can represent a central value or values from a plurality of values. In other examples, an inlet pressure and outlet pressure of a liquid to liquid heat exchanger can be utilized to determine a differential pressure for the server rack.

The memory resource 210 can include instructions 216 that can be executable by a processing resource to identify a first chassis coupled to the server rack as a failed chassis based on the differential pressure between the inlet and the discharge of the first chassis. In some examples, a determination that the differential pressure of the server rack is below a threshold differential pressure can initiate a determination of each inlet pressure and outlet pressure for each of the plurality of server chassis coupled to the server rack to identify a chassis cooling system that has failed or is non-functional. In some examples, the inlet pressure and outlet pressure for each chassis can be determined based on measured sensor values as described herein. In some examples, the inlet pressure and outlet pressure for each chassis can be utilized to determine a differential pressure for each chassis. The differential pressure for the first chassis can be below a threshold differential pressure and be an indication that the cooling system for the first chassis is non-functional or failed.

The memory resource 210 can include instructions 218 that can be executable by a processing resource to alter settings of a second chassis to provide additional cooling resources to the first chassis in response to identifying the first chassis as a failed chassis. As described herein, a cooling system of the first chassis can be independent of a cooling system of the second chassis during normal operation. As used herein, the term independent, can for example, be utilized to describe devices or systems that may not utilize resources of other systems. That is, the cooling system of the first chassis can operate to a manufacturer specification even when the cooling system of the second chassis is non-functional or failed. For example, a server rack can include a first cooling system of a first chassis that includes a first pump to provide cooling resources (e.g., liquid, etc.) to the first cooling system from an input manifold. In addition, the server rack can include a second cooling system of a second chassis that includes a second pump to provide cooling resources to the second cooling system from the input manifold. In this example, the first pump can become non-functional or fail (e.g., lose power, etc.). In this example, a failure of the first pump may not affect the functionality of the second pump or the second cooling system of the second chassis.

In some examples, the altered settings can include settings that can direct cooling resources originally designated for the second chassis to the first chassis. For example, the second chassis can include a pump that is designated to circulate cooling resources within a cooling system of the second chassis. In this example, the settings of the pump of the second chassis can be altered to also provide cooling resources to the first chassis. In some examples, the first chassis and the second chassis can be connected by an auxiliary input manifold. In some examples, the altered settings can include utilizing the auxiliary input manifold. For example, when a failure is detected at the first chassis, the auxiliary input manifold can be utilized between the first chassis and the second chassis to allow the pump from the second chassis to provide cooling resources to the first chassis via the auxiliary input manifold.

In some examples, the altered settings can include altering settings to increase a pump speed of a chassis pump of the second chassis to provide cooling resources for the first chassis and the second chassis. As described herein, the pump (e.g., chassis pump) for the second chassis can be originally designated to circulate cooling resources for the second chassis. Thus, the settings of the pump for the second chassis may be altered (e.g., increased pump speed, etc.) so that the pump for the second chassis can provide cooling resources for both the first chassis and the second chassis. In some examples, additional pumps for the second chassis can be activated when a failure is detected at the first chassis. For example, the second chassis can include a first pump and a second pump. In this example, the first pump can be activated and the second pump can be deactivated during normal operation. In this example, settings of the second pump can be altered to activate the second pump when a failure is detected at the first chassis such that the second pump can provide cooling resources to the first chassis. In these examples, the first pump and the second pump can be coupled to the second chassis as described herein.

In some examples, the number of altered settings can include settings to be altered when it is determined that the first chassis is no longer non-functional or is functioning normally. For example, it can be determined that power was restored to the first chassis or that the controller of the first chassis is operating normally. In some examples, the settings can include settings to stop providing cooling resources to the first chassis when it is determined that the failure is no longer occurring at the first chassis. In some examples, the auxiliary input manifold can be deactivated or not utilized between the first chassis and the second chassis. In some examples, the pump speed of the chassis pump for the second chassis can be lowered to circulate cooling resources within the second chassis and not the first chassis.

The memory resource 210 can be utilized within the second chassis and alter settings of the first chassis when a failure of the first chassis occurs. In other examples, the memory resource 210 can be a central resource that can be utilized to perform functions relating to the server rack. The memory resource 210 can provide additional failover and redundancy for a server rack that includes a plurality of chassis.

Figure 3:
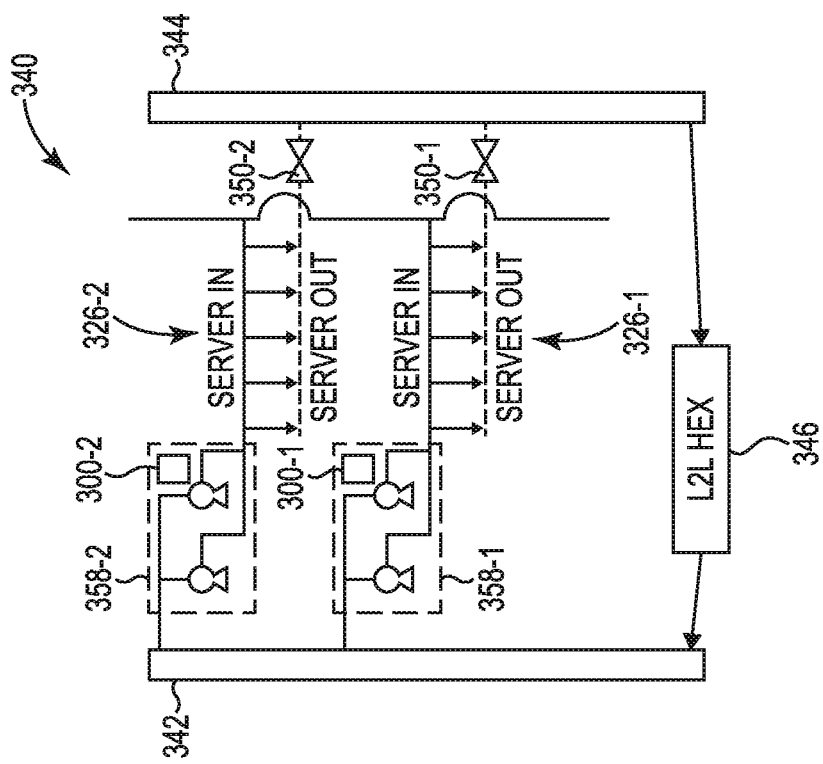
FIG. 3 illustrates an example system for a chassis cooling resource consistent with the present disclosure.

FIG. 3 illustrates an example system 320 for a chassis cooling resource consistent with the present disclosure. In some examples, a cooling system of the first chassis 326-1 can be separated from the cooling system of the second chassis 326-2. For example, the cooling system of the first chassis 326-1 can include a first pump 358-1, a first inlet 352-1, a first discharge outlet 350-1, a first fluid path, and/or a first liquid reserve to provide cooling resources to the first chassis 326-1. In some examples, the first pump 358-1 can include one or more pumps. For examples, the first pump 358-1 can be a plurality of pumps that service the first chassis 326-1. In this example, the cooling system of the second chassis 326-2 can include a second pump 358-2, a second inlet 352-2, a second discharge outlet 350-2, a second fluid path, and/or a second liquid reserve to provide cooling resources to the second chassis 326-2.

In some examples, the system 340 can include a first chassis controller 300-1 (e.g., controller 100 as referenced in FIG. 1, memory resource 210 as referenced in FIG. 2, controller 300-1, 300-2 as referenced in FIG. 3, etc.) coupled to a first chassis 326-1 to control functions of a first pump 358-1 and a first cooling system coupled to the first chassis 326-1, wherein the first pump 358-1 receives cooling resources from a liquid to liquid heat exchanger 346 coupled to a third chassis via an input manifold 342. The third chassis that includes the liquid to liquid heat exchanger 346 is not a server chassis that includes computing devices such as server blades, but is a position on the server rack where a server chassis could be positioned, but is replaced with the liquid to liquid heat exchanger 346.

In some examples, the system 340 can include a second chassis controller 300-2 coupled to a second chassis 326-2 to control functions of a second pump 358-2 and a second cooling system coupled to the second chassis 326-2, wherein the second pump 358-2 receives cooling resources from the liquid to liquid heat exchanger 346 coupled to the third chassis via the input manifold 342. In some examples, the second chassis controller 300-2 can determine that the first chassis controller 300-1 has failed. In these examples, the second chassis controller 300-2 can take over control of the first chassis 326-1 to control functions of the first pump 358-1 and the first cooling system coupled to the first chassis 326-1.

In some examples, the system 340 can include an output manifold 344 to receive cooling resources from the liquid cooling system of the first server chassis 326-1 and cooling resources from the liquid cooling system of the second server chassis 326-2. As used herein, a liquid cooling system can, for example, refer to a liquid pathway within a chassis or server blade, an inlet, a pump, and/or an outlet as described herein.

In some examples, the system 340 can include an input manifold 342 to provide cooling resources to the first pump 358-1 at the first server chassis 326-1 and to provide cooling resources to the second pump 358-2 at the second server chassis 326-2. In some examples, the input manifold 342 can be positioned between the liquid to liquid heat exchanger 346 and the chassis pumps 358-1, 358-2. That is, the liquid to liquid heat exchanger 346 can provide liquid to the first pump 358-1 coupled to the first server chassis 326-1 and provide liquid to the second pump 358-2 coupled to the second server chassis 326-2.

In some examples, the system 340 can include a first pump 358-1 that is electrically coupled to a first power supply (e.g., power distribution unit, etc.) that provides electrical power to the first server chassis 326-1 and a second pump 358-2 that is electrically coupled to a second power supply that provides electrical power to the second server chassis 326-2. As described herein, each of the plurality of server chassis 326-1, 326-2 can be coupled to a different connection of a power supply or power distribution unit. In some examples, the first pump 358-1 and the second pump 358-2 can be electrically coupled to an auxiliary power supply. In some examples, the auxiliary power supply can include an electrical connection between the first chassis 326-1 and the second chassis 326-2, such that power can be provided to the first chassis 326-1 by the second chassis 326-2 and vice versa.

Figure 4:
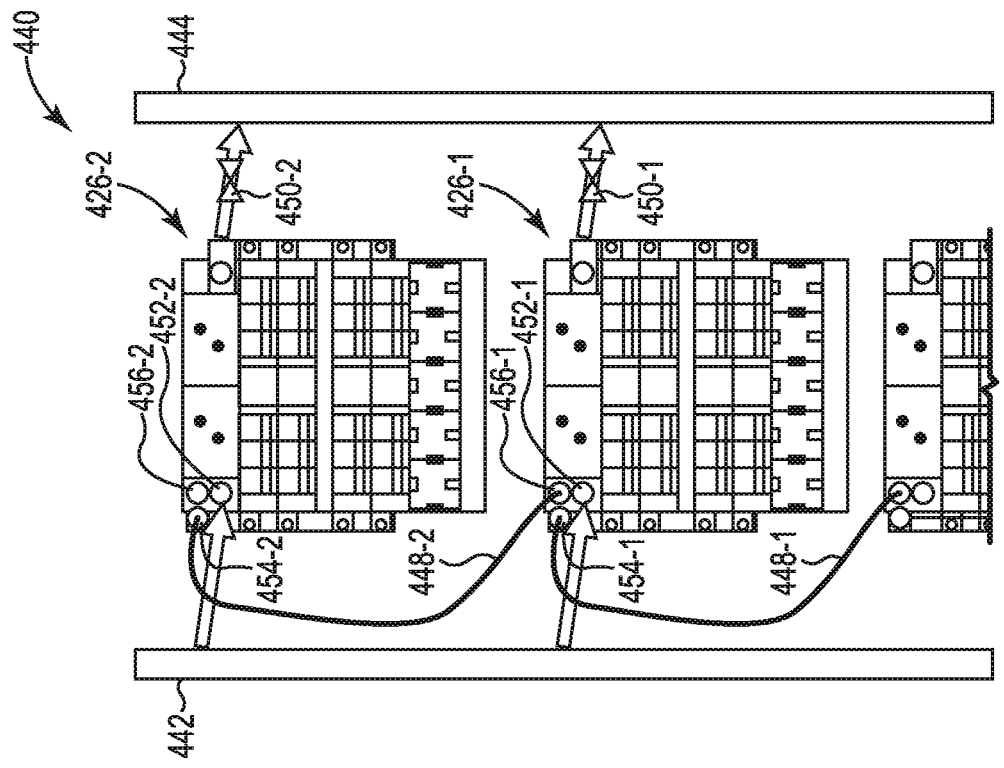
FIG. 4 illustrates an example system for a chassis cooling resource consistent with the present disclosure.

FIG. 4 illustrates an example system 440 for a chassis cooling resource consistent with the present disclosure. FIG. 4 illustrates an example schematic representation illustrated on the left side of FIG. 4 and an example image representation illustrated on the right side of FIG. 4. In some examples, the schematic representation on the left can be a schematic of the image representation on the right. In some examples, the system 440 can illustrate an example server that includes a first chassis 426-1 and a second chassis 426-2. As described herein, the first chassis 426-1 can be physically separated, communicatively separated, and/or electrically separated from the second chassis 426-2.

In some examples, a cooling system of the first chassis 426-1 can be separated from the cooling system of the second chassis 426-2. For example, the cooling system of the first chassis 426-1 can include a first pump 458-1, a first inlet 452-1, a first discharge outlet 450-1, a first fluid path, and/or a first liquid reserve to provide cooling resources to the first chassis 426-1. In some examples, the first pump 458-1 can include one or more pumps. For examples, the first pump 458-1 can be a plurality of pumps that service the first chassis 426-1. In this example, the cooling system of the second chassis 426-2 can include a second pump 458-2, a second inlet 452-2, a second discharge outlet 450-2, a second fluid path, and/or a second liquid reserve to provide cooling resources to the second chassis 426-2.

In some examples, the system 440 can include a first chassis controller (e.g., controller 100 as referenced in FIG. 1, memory resource 210 as referenced in FIG. 2, controller 300-1, 300-2 as referenced in FIG. 3, etc.) coupled to a first chassis 426-1 to control functions of a first pump 458-1 and a first cooling system coupled to the first chassis 426-1, wherein the first pump 458-1 receives cooling resources from a liquid to liquid heat exchanger 446 coupled to a third chassis via an input manifold 442.

In some examples, the system 440 can include a second chassis controller coupled to a second chassis 426-2 to control functions of a second pump 458-2 and a second cooling system coupled to the second chassis 426-2, wherein the second pump 458-2 receives cooling resources from the liquid to liquid heat exchanger 446 coupled to the third chassis via the input manifold 442.

In some examples, the system 440 can include an output manifold 444 to receive cooling resources from the liquid cooling system of the first server chassis 426-1 and cooling resources from the liquid cooling system of the second server chassis 426-2. As used herein, a liquid cooling system can, for example, refer to a liquid pathway within a chassis or server blade, an inlet, a pump, and/or an outlet as described herein.

In some examples, the system 440 can include an input manifold 442 to provide cooling resources to the first pump 458-1 at the first server chassis 426-1 and to provide cooling resources to the second pump 458-2 at the second server chassis 426-2. In some examples, the input manifold 442 can be positioned between the liquid to liquid heat exchanger 446 and the chassis pumps 458-1, 458-2. That is, the liquid to liquid heat exchanger 446 can provide liquid to the first pump 458-1 coupled to the first server chassis 426-1 and provide liquid to the second pump 458-2 coupled to the second server chassis 426-2.

In some examples, the system 440 can include a first pump 458-1 that is electrically coupled to a first power supply (e.g., power distribution unit, etc.) that provides electrical power to the first server chassis 426-1 and a second pump 458-2 that is electrically coupled to a second power supply that provides electrical power to the second server chassis 426-2. As described herein, each of the plurality of server chassis 426-1, 426-2 can be coupled to a different connection of a power supply or power distribution unit. In some examples, the first pump 458-1 and the second pump 458-2 can be electrically coupled to an auxiliary power supply. In some examples, the auxiliary power supply can include an electrical connection between the first chassis 426-1 and the second chassis 426-2, such that power can be provided to the first chassis 426-1 by the second chassis 426-2 and vice versa.

In some examples, the system 440 can include an auxiliary input manifold 448. In some examples, the auxiliary input manifold 448 can be separate from the input manifold 442. In some examples, the input manifold 442 can be coupled to each of the plurality of chassis 426-1, 426-2 via a parallel connection. For example, the input manifold 442 can include a pathway with a plurality of outputs to couple to corresponding inlets. In this way each inlet of the plurality of chassis 426-1, 426-2 are coupled directly to the liquid to liquid heat exchanger 446. In some examples, the liquid to liquid heat exchanger 446 can be coupled to a server chassis location (e.g., a position of the server rack that can receive a server chassis, etc.) to provide cooling resources to the first pump 458-1 coupled to the first liquid cooling system of the first chassis 426-1 and to the second pump 458-2 coupled to the second liquid cooling system of the second chassis 426-2.

In some examples, the auxiliary input manifold 448-1, 448-2 can be coupled to the plurality of chassis 426-1, 426-2. For example, the first chassis 426-1 can be coupled to the auxiliary input manifold 448-1 at an auxiliary input 454-1. In this example, the auxiliary input manifold 448-1 can be coupled to an auxiliary output of a different chassis. In this example, the auxiliary input manifold 448-2 can be coupled to an auxiliary output 456-1 of the first chassis 426-1 and an auxiliary input 454-2 of the second chassis 426-2. In some examples, the second chassis 426-2 can also include an auxiliary output 456-2 that can be utilized to couple the second chassis 426-2 to an auxiliary input of a different chassis. Said another way, the auxiliary input manifold 448 can be coupled to the auxiliary output 456-1 of the first liquid cooling system of the first chassis 426-1 and the auxiliary input 454-2 of the second liquid cooling system of the second chassis 426-2. In some examples, the auxiliary input manifold 448-1, 448-2 can create a parallel pathway for the chassis pumps 458-1, 458-2 to share across a plurality of chassis 426-1, 426-2. In some examples, every chassis can linked by a high pressure side that utilizes the pumps 458-1, 458-2 in order to create a shared system to improve reliability and resiliency in the event one or more of the pumps 458-1, 458-2 in the system 440 are not functioning.

In some examples, the system 440 can include a first pump 458-1 coupled to a first server chassis 426-1 and a liquid cooling system of the first server chassis 426-1. In some examples, the system 440 can include a first chassis pump 458-1 coupled to the first chassis 426-1 and a second chassis pump 458-2 coupled to the second chassis 426-2. In some examples, the first chassis pump 458-1 can be separate from the second chassis pump 458-2. For example, during normal operation, the first chassis pump 458-1 can provide cooling resources or circulate cooling resources for a first cooling system of the first chassis 426-1 without providing cooling resources to a cooling system of the second chassis 426-2. In a similar way, during normal operation, the second chassis pump 458-2 can provide cooling resources for a second cooling system of the second chassis 426-2 without providing cooling resources to a cooling system of the first chassis 426-1. In some examples a normal operation can be a first state or active state. In some examples, a failure can be a second state or inactive state. Thus, in some examples, first pump 458-1 may provide cooling resources to the first liquid cooling system of the first chassis 426-1 during a first state of the system. In addition, the first pump 458-1 may provide cooling resources to the first liquid cooling system of the first chassis 426-1 and to the second liquid cooling system of the second chassis 426-2 during a second state of the system. In some examples, the first server chassis 426-1 can be online during the first state of the system and the second server chassis 426-2 can be offline during the second state of the system.

In some examples, a first controller of the first chassis 426-1 can be utilized to control functions of a first cooling system of the first chassis 426-1 and a second controller of the second chassis 426-2 can be utilized to control functions of a second cooling system of the second chassis 426-2. For example, the first controller of the first chassis 426-1 can be utilized to control a pump speed of the chassis pump 458-1 coupled to the first chassis 426-1. In another example, the second controller of the second chassis 426-2 can be utilized to control a pump speed of the chassis pump 458-2 coupled to the second chassis 426-2. In some examples, the first controller can alter settings of the chassis pump 458-1 based on operation conditions of the first chassis 426-1.

For example, the first chassis 426-1 may be running at a relatively high capacity. In this example, the first controller of the first chassis 426-1 can alter the pump speed to an increased pump speed to ensure components are operating at a particular temperature during the relatively high capacity. In this example, the second controller of the second chassis 426-2 can alter a pump speed of the pump 458-2 based on operation conditions of the second chassis 426-2 independent of the first chassis 426-1. In this way, each chassis can be independently controlled by a corresponding controller based on an operation condition of the chassis. As used herein, operation condition can, for example, include a performance level that corresponds to heat generation of components. In some examples, a speed of the pump 458-1 can be based on a power level of the plurality of servers within the first server chassis 426-1. For example, a controller of the first chassis 426-1 can determine a power level being drawn by the plurality of servers coupled to the first chassis 426-1. In this example, the pump speed of the pump 458-1 can be altered based on the determined power level. In some examples, the pump speed of the pump 458-2 can be altered based on the determined power level of the second chassis 426-2 and the first chassis 426-1 when there is a failure associated with the first chassis 426-1 and the second chassis 426-2 is providing additional cooling resources to the first chassis 426-1.

In some examples, the second controller of the second chassis 426-2 can determine that a failure has occurred at the first chassis 426-1. For example, the second controller can determine that the chassis pump 458-1 has failed. In this example, the second controller can alter a settings of the chassis pump 458-2 to provide additional cooling resources to the first chassis 426-1 and/or cooling system of the first chassis 426-1. In this example, the second controller can utilize the auxiliary input manifold 448-1 to connect the cooling system of the first chassis 426-1 to the cooling system of the second chassis 426-2. That is, the second pump 458-2 can provide cooling resources to the liquid cooling system of the first chassis 426-1 when the first chassis 426-1 is deactivated. In this way, the chassis pump 458-2 can provide cooling resources to both the second chassis 426-2 and the first chassis 426-1 via the auxiliary input manifold 448-1 and the increased pump speed of the pump 458-2. In this way, the system 440 can provide cooling resource redundancy between the chassis 426-1, 426-2 and also provide cooling resources for each chassis based on operation conditions of the chassis 426-1, 426-2.

In some examples, the auxiliary input manifold 448-1 can be a second input manifold that equalizes a pressure of the first liquid cooling system of the first chassis 426-1 and the second liquid cooling system of the second chassis 426-2. For example, pressure drops or increases can occur when a cooling system fails and is supplemented with cooling resources from a different cooling system. In some examples, cooling resources are directed from the first liquid cooling system of the first chassis 426-1 to the second liquid cooling system of the second chassis 426-2 when the second pump 458-2 fails. For example, a liquid reserve from the first cooling system of the first chassis 426-1 can be utilized for the second liquid cooling system of the second chassis 426-2 when the second pump 458-2 fails or becomes non-functional (e.g., loses power, mechanical failure, etc.).

Figure 5:
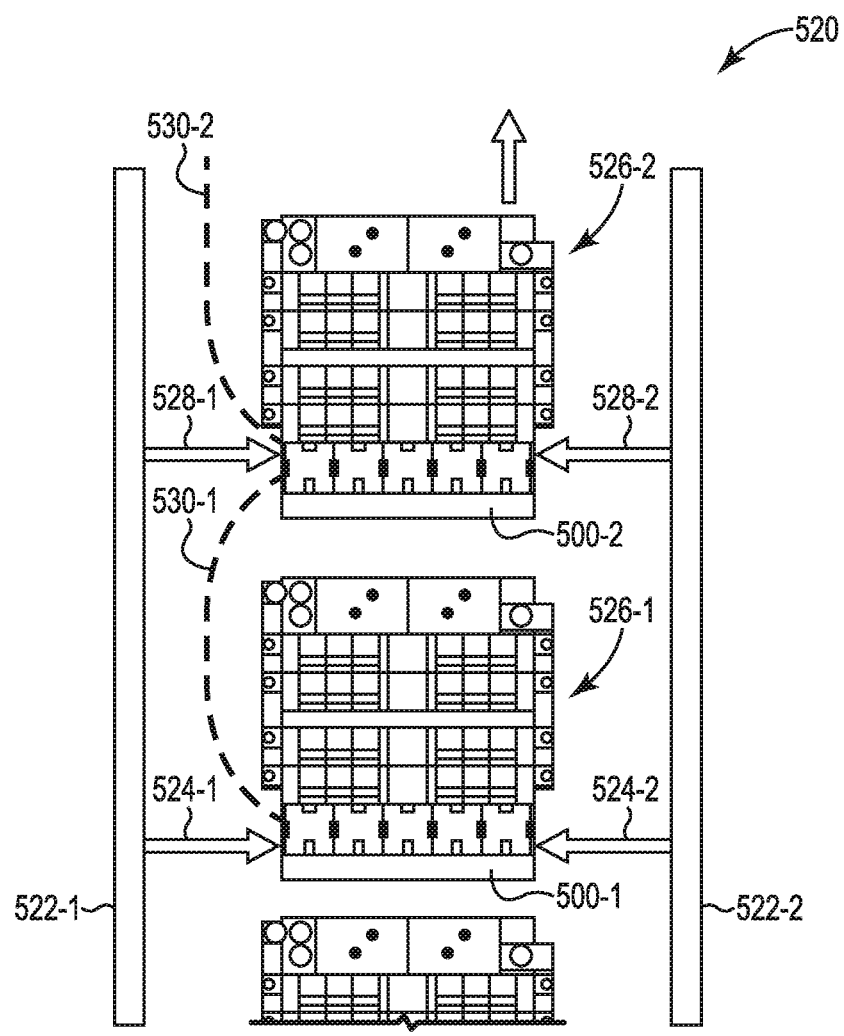
FIG. 5 illustrates an example system for a chassis cooling resource consistent with the present disclosure.

FIG. 5 illustrates an example system 520 for a chassis cooling resource consistent with the present disclosure. System 520 can include a server rack that includes a plurality of chassis 526-1, 526-2 (e.g., server chassis, etc.). As described herein, a chassis 526-1, 526-2 can include a plurality of server blades that each include computing devices. In some examples, a first chassis 526-1 can be independent from a second chassis 526-2. For example, the first chassis 526-1 can perform functions that are independent from the functions performed by the second chassis 526-2.

In some examples, the cooling system for the first chassis 526-1 can be independent from the cooling system for the second chassis 526-2. In some examples, the first chassis 526-1 can include a first controller 500-1 (e.g., controller 100 as referenced in FIG. 1, memory resource 210 as referenced in FIG. 2, etc.) and the second chassis 526-2 can include a second controller 500-2 (e.g., controller 100 as referenced in FIG. 1, memory resource 210 as referenced in FIG. 2, etc.).

In some examples, the system 520 can include a first chassis controller 500-1 coupled to a first chassis 526-1 to control functions of a first pump and a first cooling system coupled to the first chassis 526-1, wherein the first pump receives cooling resources from a liquid to liquid heat exchanger coupled to a third chassis via an input manifold. In some examples, the first chassis controller 500-1 can be independent from the second chassis controller 500-2 when the first chassis 526-1 and the second chassis 526-2 are functioning normally (e.g., functioning within manufacturer specifications, etc.). For example, the first chassis controller 500-1 can be restricted from performing functions designated to the second chassis controller 500-2 when the first chassis 526-1 and the second chassis 526-2 are functioning normally.

In addition, the first pump coupled to the first chassis can be independent from a second pump coupled to the second chassis 526-2. For example, the first pump can provide cooling resources to the first cooling system of the first chassis 526-1 without affecting or being effected by the second pump coupled to the second chassis 526-2. During normal operation (e.g., when a failure does not exist, when a system is operating within manufacturer specifications, etc.) the first pump can circulate cooling resources to a first cooling system of the first chassis 526-1 and the second pump can circulate cooling resources to a second cooling system of the second chassis 526-2.

In some examples, the system 520 can include a second chassis controller 500-2 coupled to a second chassis 526-2 to control functions of a second pump and a second cooling system coupled to the second chassis 526-2, wherein the second pump receives cooling resources from the liquid to liquid heat exchanger coupled to the third chassis via the input manifold. In some examples, the first chassis 526-2 and the second chassis 526-2 can be physically separated from the liquid to liquid heat exchanger. For example, the first chassis 526-1 can include a first enclosure and the second chassis 526-2 can include a second enclosure that is separate from the first chassis 526-1.

In some examples, the first chassis 526-1 and the second chassis 526-2 can be electrically separated. For example, the first chassis 526-1 can be coupled to a first power distribution unit 522-1 via a first connection 524-1. In this example, the second chassis 526-2 can be coupled to the first power distribution unit 522-1 via a second connection 528-1. In some examples, the first power distribution unit 522-1 can include a plurality of connections (e.g., connections 528-1, 524-1, etc.). In some examples, each connection of the first power distribution unit 522-1 can be electrically independent. As used herein, electrically independent can, for example, include providing electrical power to a first load via first connection without affecting a second load connected to a second connection. In this way, power can be provided to connection 528-1 even if connection 524-1 fails.

In some examples, the system 520 can include a second power distribution unit 522-2. The second power distribution unit 522-2 can be coupled to the first chassis 526-1 via a connection 524-2 and coupled to the second chassis 526-2 via connection 528-2. In some examples, the second power distribution unit 522-2 can provide electrical power to the first chassis 526-1 and/or to the second chassis 526-2 when the first power distribution unit 522-2 fails.

In some examples, the system 520 can include an auxiliary connection 530-1 that can electrically couple and/or communicatively couple the first chassis 526-1 to the second chassis 526-2. In some examples, the auxiliary connection 530-1 can be utilized by the controller 500-2 coupled to the second chassis 526-2 to alter settings of a cooling system of the first chassis 526-1. For example, the auxiliary connection 530-1 can be a communication link between a controller 500-1 of the first chassis 526-1 and a controller 500-2 of the second chassis 526-2. In some examples, the auxiliary connection 530-1 can be a wired or wireless connection between the first chassis 526-1 and the second chassis 526-2 to allow the controller 500-2 of the second chassis 526-2 to alter settings of the first chassis 526-1 when a failure is detected at the first chassis 526-1. For example, the controller 500-2 of the second chassis 526-2 can utilize the auxiliary connection 530-1 to provide power to a pump coupled to the first chassis 526-1, alter settings of the pump coupled to the first chassis 526-1, and/or alter settings of the controller 500-1 of the first chassis 526-1. In some examples, the system 520 can include additional auxiliary cables (e.g., auxiliary cable 530-2, etc.) to couple the second chassis 526-2 to additional server chassis coupled to the server rack.

In some examples, the auxiliary connection 530-1 can be activated and deactivated in response to a detected failure. For example, the auxiliary connection 530-1 can be deactivated when the first chassis 526-1 and the second chassis 526-2 are functioning normally. In another example, the auxiliary connection 530-1 can be activated when a failure is detected at the first chassis 526-1 or the second chassis 526-2. In this way, the system 520 allows for each chassis 526-1, 526-2 to function independent of the other chassis coupled to the server rack until there is a failure.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. As used herein, the designator "N", particularly with respect to reference numerals in the drawings, indicates that a number of the particular feature so designated can be included with examples of the present disclosure. The designators can represent the same or different numbers of the particular features. Further, as used herein, "a number of" an element and/or feature can refer to one or more of such elements and/or features.

What is claimed:

1. A system, comprising:
    a first chassis controller to control functions of a first pump and a first cooling system of a first chassis coupled to a server rack, wherein the first pump receives cooling resources from a liquid to liquid heat exchanger coupled to a third chassis via an input manifold and provides the received cooling resources to the first cooling system; and
    a second chassis controller to control functions of a second pump and a second cooling system of a second chassis coupled to the server rack, wherein the second pump receives cooling resources from the liquid to liquid heat exchanger via the input manifold and provides the received cooling resources to the second cooling system;
    wherein a high pressure side of the first cooling system is connected to-a high pressure side of the second cooling system via an auxiliary manifold such that:
    the first pump can provide cooling resources to the second cooling system via the auxiliary manifold if the second pump fails, and
    the second pump can provide cooling resources to the first cooling system via the auxiliary manifold if the second first pump fails.

2. The system of claim 1, wherein the second chassis controller includes instructions to:
    determine a failure of the first chassis controller; and
    control functions of the first pump and the first cooling system of the first chassis.

3. The system of claim 1, wherein the liquid to liquid heat exchanger is separated from the first chassis.

4. The system of claim 1,
    wherein the first controller comprises instructions to detect a failure of the second pump and, in response, increase a speed of the first pump, and
    wherein the second controller comprises instructions to detect a failure of the first pump and, in response, increase a speed of the second pump.

* * * * *